(12) United States Patent
Kim

(10) Patent No.: US 8,008,210 B2
(45) Date of Patent: Aug. 30, 2011

(54) EXPOSURE MASK WITH DOUBLE PATTERNING TECHNOLOGY AND METHOD FOR FABRICATING SEMICONDUCTOR DEVICE USING THE SAME

(75) Inventor: Seo Min Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 796 days.

(21) Appl. No.: 12/000,059

(22) Filed: Dec. 7, 2007

(65) Prior Publication Data

US 2009/0004575 A1 Jan. 1, 2009

(30) Foreign Application Priority Data

Jun. 29, 2007 (KR) ........................ 10-2007-0065280

(51) Int. Cl.
*H01L 21/302* (2006.01)
*C03C 15/00* (2006.01)

(52) U.S. Cl. ............................ 438/717; 216/41; 216/47
(58) Field of Classification Search .................... 216/41, 216/47, 58; 438/703, 736; 430/5, 314
See application file for complete search history.

(56) References Cited

U.S. PATENT DOCUMENTS

| 6,184,151 B1 * | 2/2001 | Adair et al. ................... 438/743 |
| 2008/0153299 A1 * | 6/2008 | Kim ............................ 438/703 |

FOREIGN PATENT DOCUMENTS

KR 1020060109091 A 10/2006
* cited by examiner

*Primary Examiner* — Lan Vinh
*Assistant Examiner* — Patti Lin
(74) *Attorney, Agent, or Firm* — IP & T Group LLP

(57) ABSTRACT

An exposure mask for forming a G-type active region with a double patterning technology includes a bar shaped first light-blocking pattern to define an I-type active region, and an island shaped second light-blocking pattern to define a bit line contact region. The first light-blocking pattern and the second light-blocking pattern are arranged alternately.

6 Claims, 9 Drawing Sheets

EXPOSURE MASK WITH DOUBLE PATTERNING TECHNOLOGY AND METHOD FOR FABRICATING SEMICONDUCTOR DEVICE USING THE SAME

This application is based upon and claims the benefit of priority to Korean Patent Application No. 10-2007-0065280, filed on Jun. 29, 2007, the entire contents of which are incorporated herein by reference.

TECHNICAL FIELD

The invention relates to an exposure process. More particularly, the invention relates to an exposure mask and a method for fabricating a semiconductor device using the same.

BACKGROUND

When a general active region of a DRAM is formed, the area of the center portion of the active region, that serves as a bit line contact region, is increased in order to increase a current amount and reduce a contact resistance with a bit line. The active region having an increased center portion is called a G-type active region.

FIG. 1 is a layout of an exposure mask for I-type active region. An exposure mask 100 includes a bar shaped light-blocking pattern 110 to define an I-type active region.

FIGS. 2a and 2b are top-views illustrating a double patterning process of forming an I-type active region of a semiconductor device. A first hard mask layer 214 is formed over a semiconductor substrate 200. A lithography process is performed using exposure mask 100 of FIG. 1 to form a second hard mask pattern 220. An exposing process is performed using exposure mask 100 of FIG. 1 to form a photoresist pattern 225 which is disposed between second hard mask patterns 220. First hard mask layer 214 is etched using second hard mask pattern 220 and photoresist pattern 225 as a mask to form a first hard mask pattern 230 that defines an I-type active region.

In order to form a hard mask pattern defining a G-type active region, an optical proximity correction ("OPC") process is performed so that a given thickness of the center portion of light-blocking pattern 110 of FIG. 1 is protruded toward both sides in a minor axis direction of the G-type active region. In the OPC process, a margin for protruding the center portion is insufficient to increase a bit line contact resistance and reduce the current amount, thereby degrading characteristics of the device.

SUMMARY

Embodiments of the invention are directed to an exposure process with a double patterning technology. According to an embodiment of the invention, the exposure process includes an exposure mask for forming a G-type active region. The exposure mask includes a bar shaped first light-blocking pattern and an island shaped second light-blocking pattern to secure an OPC process margin and reduce a bit line contact resistance, thereby improving characteristics of the device.

According to an embodiment consistent with the invention, an exposure mask for forming a G-type active region with a double patterning technology includes a bar shaped first light-blocking pattern to define an I-type active region. The exposure mask includes an island shaped second light-blocking pattern to define a bit line contact region. The second light-blocking pattern is separated from the first light-blocking pattern.

According to an embodiment consistent with the invention, a method for fabricating a semiconductor device includes forming a first hard mask layer over a semiconductor substrate. A second hard mask layer is formed over the first hard mask layer. The second hard mask layer is etched using a photolithography process with the exposure mask of the above described exposure mask to form a second hard mask pattern. A photoresist pattern is formed using an exposing process with the shifted exposure mask. The photoresist pattern overlaps the second hard mask pattern. The first hard mask layer is etched using the second hard mask pattern and the photoresist pattern as a mask to form a first hard mask pattern. The first hard mask pattern defines a G-type active region. The second hard mask pattern and the photoresist pattern are removed. The semiconductor substrate is etched using the second hard mask pattern to form a trench for device isolation.

DETAILED DESCRIPTION

The invention relates to an exposure process employing a double patterning technology ("DPT"). In one embodiment of the invention, the exposure process includes an exposure mask employing DPT.

Figure 1:
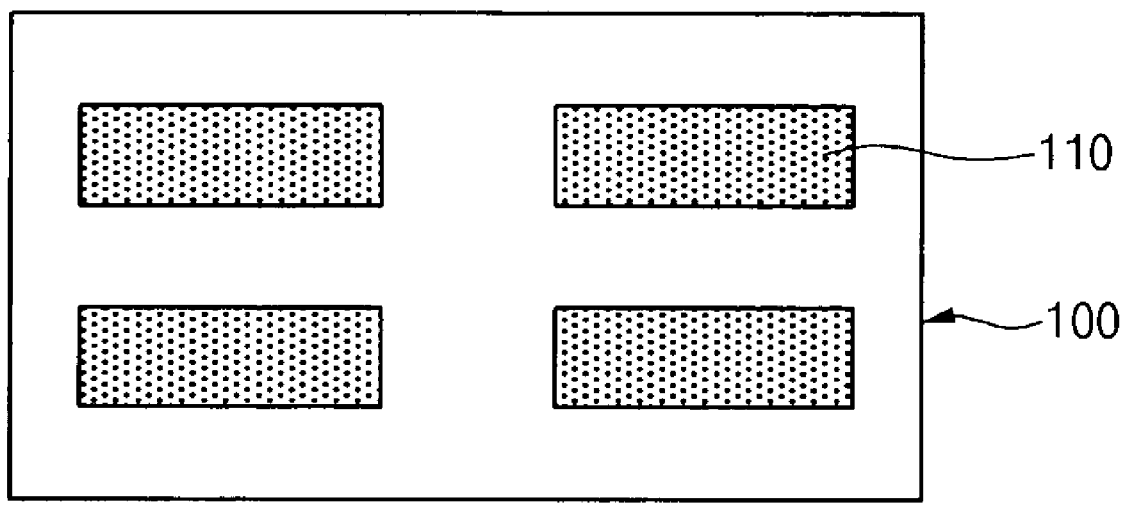
FIG. 1 is a layout of an exposure mask for forming an I-type active region of a semiconductor device.
Figure 2A:
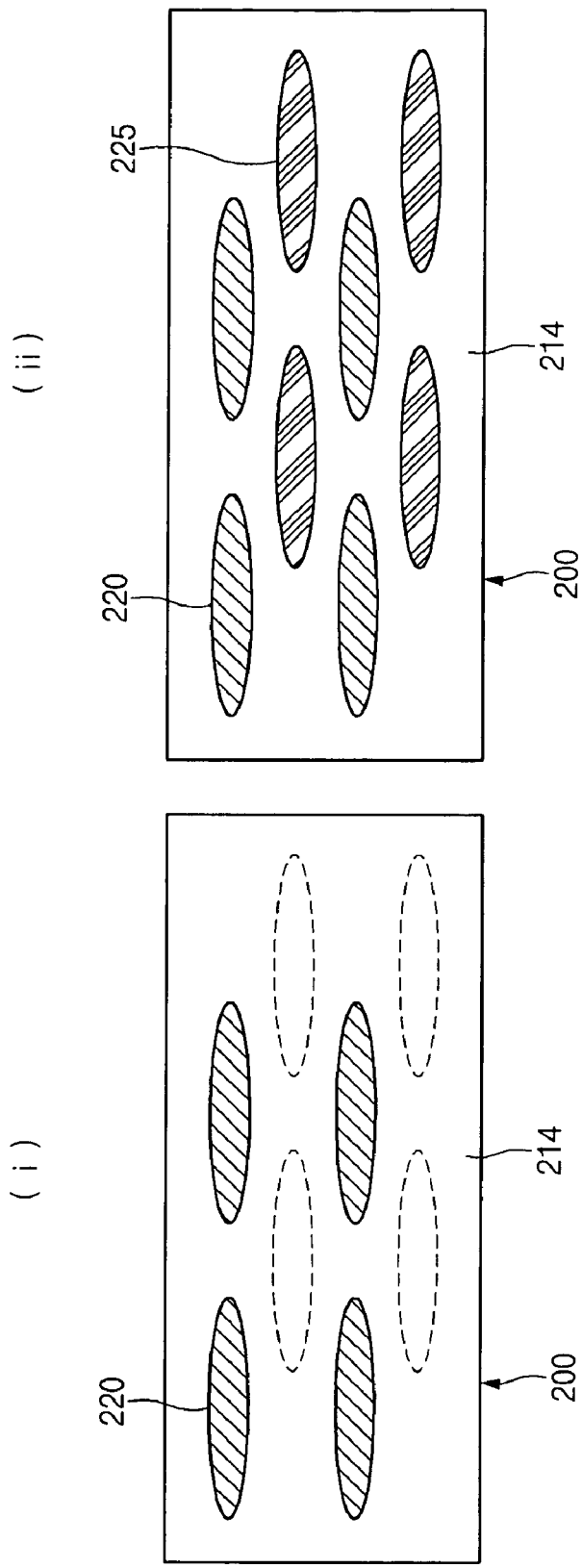
FIGS. 2a and 2b are top-views illustrating a double patterning process of forming an I-type active region of a semiconductor device.
Figure 2B:
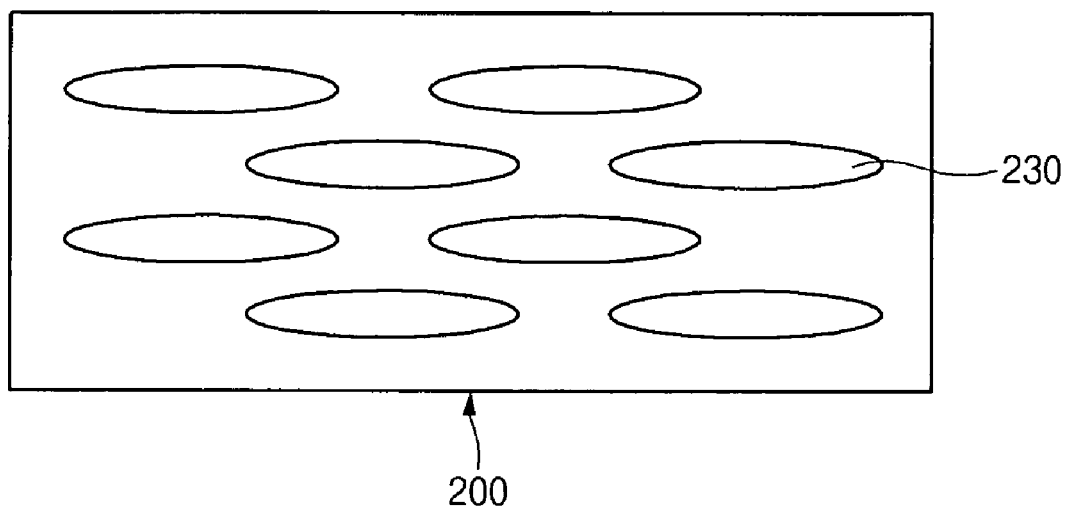
Figure 3:
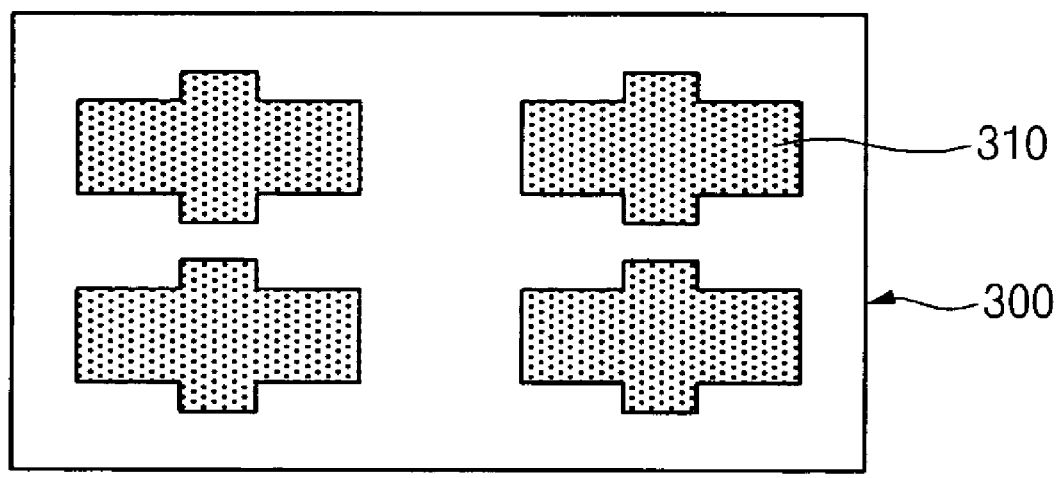
FIG. 3 is a layout of an exposure mask for forming a G-type active region of a semiconductor device according to an embodiment consistent with the invention.

FIG. 3 is a layout of an exposure mask for forming a G-type active region of a semiconductor device according to an embodiment consistent with the invention. An exposure mask 300 includes a bar shaped light-blocking pattern 310 to define an I-type active region. A center portion (that is, a bit line contact region) of the light-blocking pattern 310 has a line-width larger than that of the other active region.

Figure 4A:
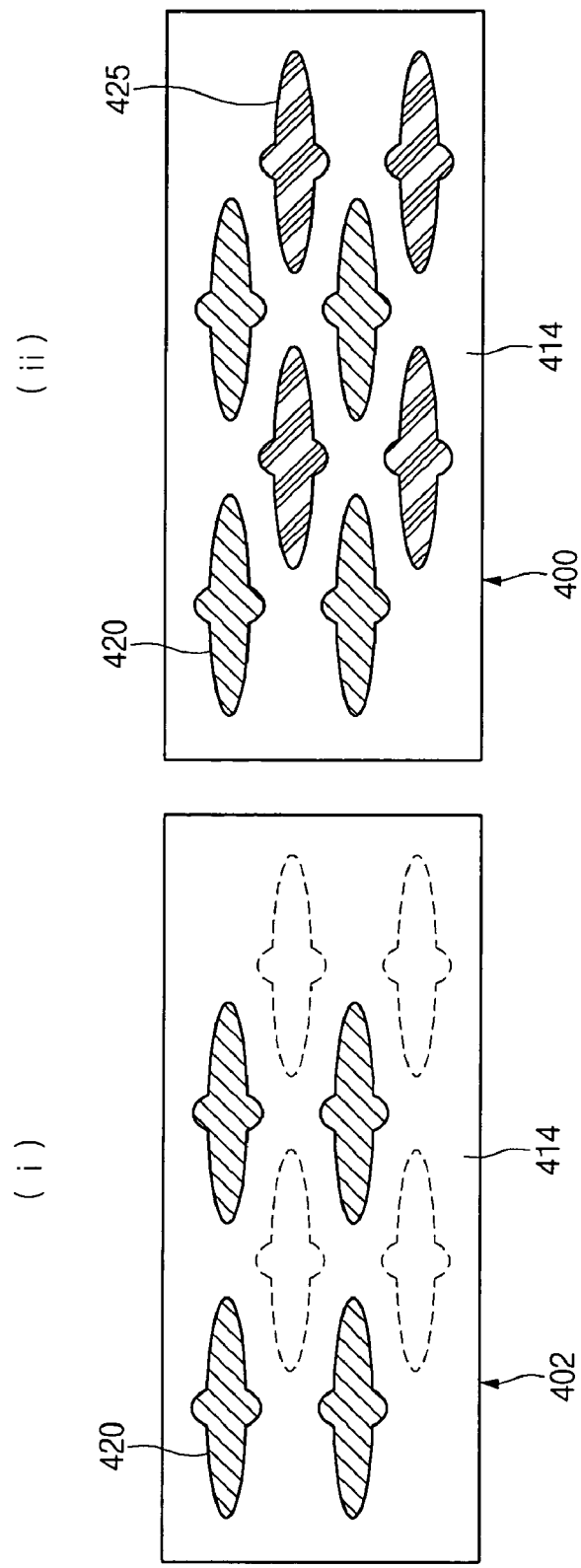
FIGS. 4a and 4b are top-views illustrating a double patterning process of forming a G-type active region of a semiconductor device according to an embodiment consistent with the invention.
Figure 4B:
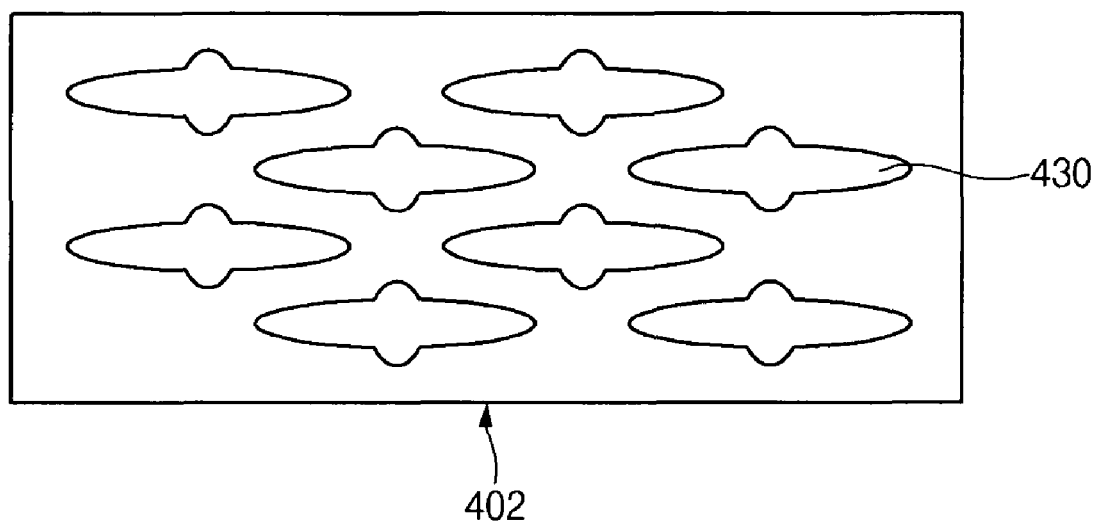

FIGS. 4a and 4b are top-views illustrating a double patterning process of forming a G-type active region of a semiconductor device according to an embodiment consistent with the invention. A first hard mask layer 414 and a second hard mask layer (not shown) are sequentially formed over a semiconductor substrate 402. A lithography process is performed using exposure mask 300 of FIG. 3 to form a second hard mask pattern 420 to define a G-type active region. A photoresist film (not shown) is formed over semiconductor substrate 402 and second hard mask pattern 420.

Exposure mask 300 of FIG. 3 is shifted at a given distance, and an exposing process is performed to form a photoresist pattern 425 between second hard mask patterns 420. First hard mask layer 414 is etched using second hard mask pattern 420 and photoresist pattern 425 as a mask to form a first hard mask pattern 430. Second hard mask pattern 420 and photoresist pattern 425 are removed. Semiconductor substrate 402 is etched using first hard mask pattern 430 as a mask to form a trench for device isolation that defines a G-type active region.

Figure 5:
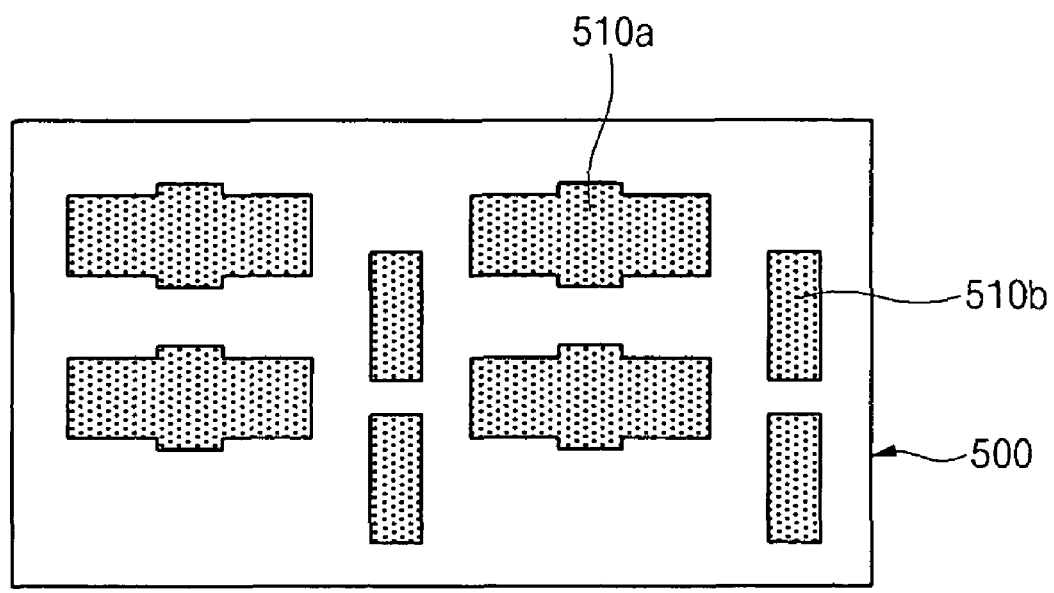
FIG. 5 is a layout of an exposure mask for forming a G-type active region of a semiconductor device according to another embodiment consistent with the invention.

FIG. 5 is a layout of an exposure mask for forming a G-type active region of a semiconductor device according to another embodiment consistent with the invention. An exposure mask 500 defines a G-type active region. Exposure mask 500 includes a bar shaped first light-blocking pattern 510a to define an I-type active region. Exposure mask 500 includes an island shaped second light-blocking pattern 510b to define a bit line contact region.

First light-blocking pattern 510a and second light-blocking pattern 510b are arranged alternately. The arrangement of first light-blocking pattern 510a and second light-blocking pattern 510b is not limited herein. A line-width of second light-blocking pattern 510b in its major axis is larger than that of first light-blocking pattern 510a in its minor axis.

A center portion of first light-blocking pattern 510a corresponds to a bit line contact region. A given thickness of the center portion of first light-blocking pattern 510a is protruded out in its minor axis. First light-blocking pattern 510a is shaped in rectangle, cruciform or diamond. The shape of first light-blocking pattern 510a is not limited herein.

Since bar shaped first light-blocking pattern 510a and island shaped second light-blocking pattern 510b are separated, a space where a pattern to define a bit line contact region is formed is located between four bar shaped first light-blocking patterns 510a. As a result, it is possible to secure a sufficient space where an OPC process is performed.

Figure 6A:
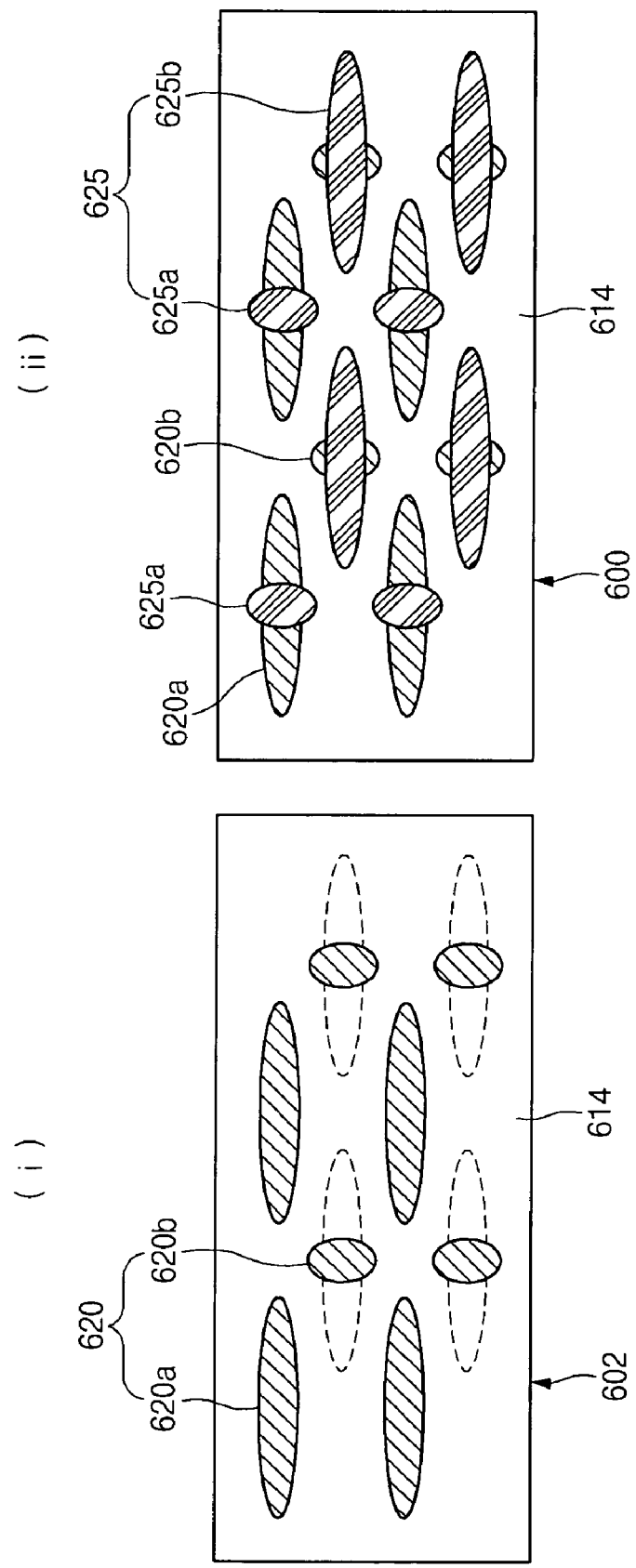
FIGS. 6a and 6b are top-views illustrating a double patterning process of forming a G-type active region of a semiconductor device according to another embodiment consistent with the invention.
Figure 6B:
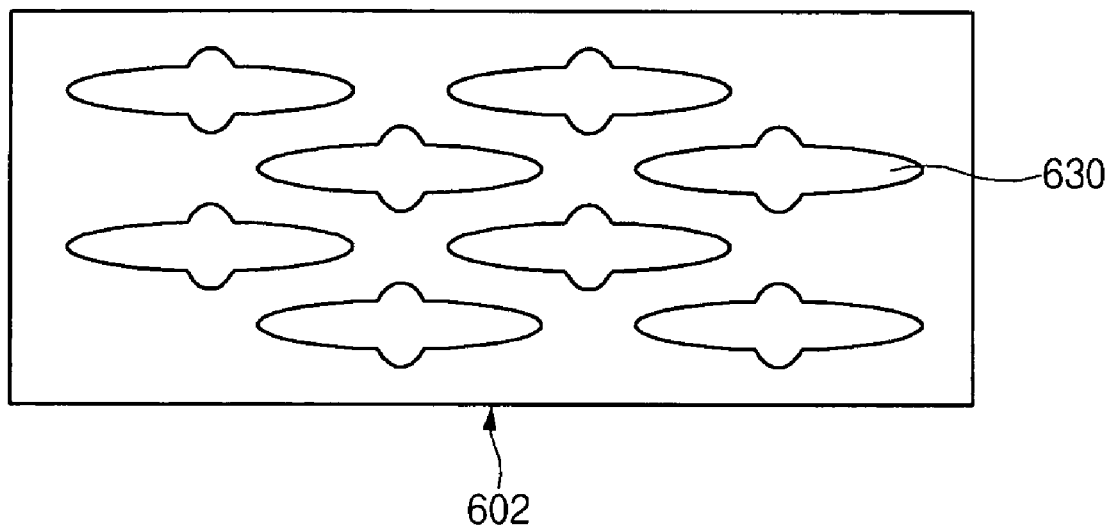

FIGS. 6a and 6b are top-views illustrating a method of fabricating a semiconductor device to form a G-type active region of a semiconductor device according to another embodiment consistent with the invention. FIGS. 6a and 6b illustrate a double patterning process of forming a G-type active region with exposure mask 500 of FIG. 5. A first hard mask layer 614 and a second hard mask layer (not shown) are formed over a semiconductor substrate 602. A lithography process is performed using exposure mask 500 of FIG. 5 to form a second hard mask pattern 620. Second hard mask pattern 620 includes a bar shaped first pattern 620a to define an I-type active region. Second hard mask pattern 620 includes a second pattern 620b to define a bit line contact region.

A line-width of second pattern 620b in its major axis is larger than that of first pattern 620a in its minor axis. First pattern 620a and second pattern 620b are arranged alternately. A center portion of first pattern 620a includes a protrusion part protruded from first pattern 620a in its minor axis by a given thickness.

Referring to FIG. 6a(ii), a photoresist film (not shown) is formed over a semiconductor substrate 602 including second hard mask pattern 620. An exposing process is performed using exposure mask 500 of FIG. 5 to form a photoresist pattern 625 overlapping second hard mask pattern 620. The exposure process is performed after exposure mask 500 of FIG. 5 is shifted to a given distance.

Photoresist pattern 625 includes an island shaped third pattern 625a to define a bit line contact region. Photoresist pattern 625 includes a bar shaped fourth pattern 625b to define an I-type active region. Third pattern 625a is overlapped with first pattern 620a of second hard mask pattern 620. Fourth pattern 625b is overlapped with second pattern 620b of second hard mask pattern 620.

Referring to FIG. 6b, first hard mask layer 614 is etched using photoresist pattern 625 and second hard mask pattern 620 to form a first hard mask pattern 630 to define a G-type active region. Photoresist pattern 625 and second hard mask pattern 620 are removed.

A portion of the semiconductor substrate 602 is etched using first hard mask pattern 630 as an etching mask to form a trench for device isolation (not shown). The trench for device isolation is filled with a device isolation insulating film to form a device isolation structure to define a G-type active region. A process of forming a gate and a process of forming a bit line are performed to obtain a semiconductor device.

As described above, according to an embodiment consistent with the invention, a G-type active region is formed using a double patterning technology with an exposure mask to secure a sufficient bit line contact region, reduce a bit line contact resistance and increase a current amount, thereby improving characteristics of the device.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating a semiconductor device, the method comprising:
    forming a first hard mask layer over a semiconductor substrate;
    forming a second hard mask layer over the first hard mask layer;
    etching the second hard mask layer using a photolithography process with an exposure mask to form a second hard mask pattern, wherein the exposure mask includes a rectangle shaped first light-blocking pattern rectangle shaped second light-blocking pattern to define a bit line contact region and the second light-blocking pattern is located diagonally from the first light-blocking pattern, wherein the second hard mask pattern includes a first pattern having a minor axis and in the direction of the minor axis, the first pattern of the second hard mask pattern is thicker along the minor axis at a centerline of the major axis than at a cross section of another part of the first pattern in the direction of the minor axis;
    forming a photoresist pattern using an exposing process with the exposure mask, the photoresist pattern overlying the second hard mask pattern;
    etching the first hard mask layer using the second hard mask pattern and the photoresist pattern as a mask to form a first hard mask pattern defining an active region;
    removing the second hard mask pattern and the photoresist pattern; and
    etching the semiconductor substrate using the first hard mask pattern to form a trench for device isolation.

2. The method of claim 1, wherein the first pattern of the second hard mask pattern is an oval shaped pattern and the second hard mask pattern further comprises an oval shaped second pattern and the first pattern and the second pattern of the second hard mask pattern are arranged alternately along a x-direction, a y-direction or both directions.

3. The method of claim 2, wherein the photoresist pattern comprises third pattern and a fourth pattern that is thicker along a centerline of the fourth pattern and the third and fourth patterns are arranged alternately.

4. The method of claim 3, wherein the third pattern overlaps the first pattern of the second hard mask pattern along a centerline of the first pattern of the second hard mask pattern.

5. The method of claim 3, wherein the second pattern of the second hard mask pattern overlaps the fourth pattern along the centerline of the forth pattern.

6. The method of claim 3, wherein the forming of the photoresist pattern using the exposing process is performed after shifting the exposure mask from a position of the exposure mask used for the etching of the second hard mask layer.

* * * * *